US007095455B2

(12) United States Patent
Jordan et al.

(10) Patent No.: US 7,095,455 B2
(45) Date of Patent: Aug. 22, 2006

(54) METHOD FOR AUTOMATICALLY ADJUSTING THE SOUND AND VISUAL PARAMETERS OF A HOME THEATRE SYSTEM

(75) Inventors: Richard J. Jordan, Simi Valley, CA (US); Omar M. Ahmad, Glendale, CA (US)

(73) Assignee: Harman International Industries, Inc., Northridge, CA (US)

( * ) Notice: Subject to any disclaimer, the term of this patent is extended or adjusted under 35 U.S.C. 154(b) by 714 days.

(21) Appl. No.: 09/813,722

(22) Filed: Mar. 21, 2001

(65) Prior Publication Data

US 2002/0136414 A1 Sep. 26, 2002

(51) Int. Cl.
*H04N 5/44* (2006.01)
*H04N 7/00* (2006.01)
*H04R 29/00* (2006.01)
*H03G 5/00* (2006.01)

(52) U.S. Cl. ...................... 348/734; 348/180; 348/189; 381/58; 381/59; 381/103

(58) Field of Classification Search ................ 381/300, 381/307, 56, 58, 113; 348/602, 603, 180–181
See application file for complete search history.

(56) References Cited

U.S. PATENT DOCUMENTS 5,386,478 A * 1/1995 Plunkett ..................... 381/103
5,497,425 A * 3/1996 Rapoport ..................... 381/18
5,666,424 A 9/1997 Fosgate et al.
5,757,438 A * 5/1998 Yoon et al. ................. 348/603
6,069,567 A * 5/2000 Zawilski ................ 340/825.22
6,072,470 A * 6/2000 Ishigaki ...................... 345/158
6,115,476 A * 9/2000 O'Connor et al. .......... 381/103
6,118,880 A * 9/2000 Kokkosoulis et al. ....... 381/303
6,195,435 B1 2/2001 Kitamura
6,332,026 B1 * 12/2001 Kuusama et al. ............. 381/17

FOREIGN PATENT DOCUMENTS

JP 08282490 10/1996

OTHER PUBLICATIONS

*Surround Sound Past, Present, and Future*, copyrighted 1998 by Dolby Laboratories Inc.
*Dolby Surround Mixing Manual*, Issue 2, copyrighted 1998 by Dolby Laboratories Inc.

* cited by examiner

*Primary Examiner*—Laura A. Grier

(57) ABSTRACT

A system is provided for setting various acoustic and visual parameters to improve the reproduction of audio signals and visual signals. The system incorporates a hand-held remote control device which operates the main surround sound unit (e.g., home theatre receiver and/or digital decoder) and the display device via electromagnetic link, for example. The remote control includes a sensor capable of detecting various types of signals emitted by a number of speakers, and a processor that makes adjustments to the signal provided to each of the speaker based on the signal received from that speaker.

13 Claims, 7 Drawing Sheets

METHOD FOR AUTOMATICALLY ADJUSTING THE SOUND AND VISUAL PARAMETERS OF A HOME THEATRE SYSTEM

BACKGROUND OF THE INVENTION

1. Field of the Invention

This invention relates generally to a system and method for remotely adjusting acoustic and visual parameters for home theatre systems including a surround sound audio system and or a visual display device. Particularly, this invention relates to a system and method of properly setting up and aligning sound fields for accurate reproduction of digital multi channel surround sound encoded audio and properly setting up visual parameters in a display device.

2. General Background and State of the Art

Some features of adjusting acoustic parameters are taught in the Plunkett Patent (U.S. Pat. No. 5,386,478) which is hereby incorporated by reference into this application. However, in recent years, film sound, television audio, and music playback formats have changed to incorporate the popularity of surround sound for improved tonality and accurate spatial reconstruction of sound. In particular, digital multi-channel surround sound technology has fostered an approach to achieve unparalleled fidelity in sound reproduction. One step in achieving that task, however, is properly setting up a sound system for optimal performance. An improperly set-up surround sound system can result in noticeably inferior sound quality and/or inaccurate reproduction of the sound the original artist or director intended. A variety of parameters, including, speaker location, listener location, phase delay, speaker level, equalization, and bass management, all play an important part in the surround sound set up and subsequent audio performance. Existing audio systems allow the user to set these parameters manually, either on a hand held remote control, or on the main surround sound unit. Parameter adjustment for multi-channel surround sound, however, is becoming increasingly complex and difficult, especially with digital multi channel audio.

Televisions, projectors, and other display devices used in home theatre systems have come a long way in recent years in regard to visual quality. However, to achieve this quality, or to achieve an intended visual reproduction, it is usually necessary that various visual parameters in the display be set, for a particular viewing environment such as a dark room. These parameters may include brightness, tint, color, white level, and contrast. Existing display devices allow the user to manually adjust these parameters, however, this can be burdensome and many viewers are not properly trained for making these settings.

Therefore, a need still exists for an apparatus and method capable of easily and completely setting a complex set of audio and visual parameters in a home theatre system, including a multichannel surround sound audio system and/or a display system.

INVENTION SUMMARY

A general feature of the present invention is to provide a system and method for setting various acoustic and visual parameters for optimal or intended reproduction of digital multi-channel surround encoded audio and for optimal or intended reproduction of a visual image from a display device. For example, one feature of the present invention is to incorporate a hand-held remote control device which operates the main surround sound unit (e.g., home theatre receiver and/or digital decoder) and the display device via electromagnetic link, for example. Of course, it is not necessary to the invention that the device be incorporated in the remote control device of the surround sound unit, or the display device.

In one embodiment of the present invention, a device may include a sensor or a plurality of sensors capable of detecting various types of signals emitted by a display device and/or an individual speaker and/or a group of speakers, a processor which is able to process the signal, and a communication device (electromagnetic) which can communicate information to and from the main surround sound unit and/or the display device. After a user issues a command on the hand-held device (27) to initiate the setup procedure, the device sends a command to the main surround sound unit (1) or the program source (2) or the display device (131) to generate the test signals (133, 21–26, 128, 129). The sensor or group of sensors on the remote device (6) then detects the test signal(s) from an output device (135) in a display device (131) and/or an individual speaker and/or a group of speakers (15–20, 120–127). It then processes the signal, determines the adjustment which needs to be made, and sends the appropriate adjustment command to the main surround sound unit (1) and/or the display device (131).

DETAILED DESCRIPTION OF THE PREFERRED EMBODIMENTS

This description is not to be taken in a limiting sense, but is made merely for the purpose of illustrating the general principles of the invention. The section titles and overall organization of the present detailed description are for the purpose of convenience only and are not intended to limit the present invention. Accordingly, the invention will be described with respect to making automatic adjustments in a digital 6-speaker (where one speaker is a subwoofer) surround sound system. It is to be understood that the particular digital surround sound format described herein is for illustration only; the invention also applies to other surround sound formats.

I. Automatic Adjustment of Surround Sound Parameters

Figure 1:
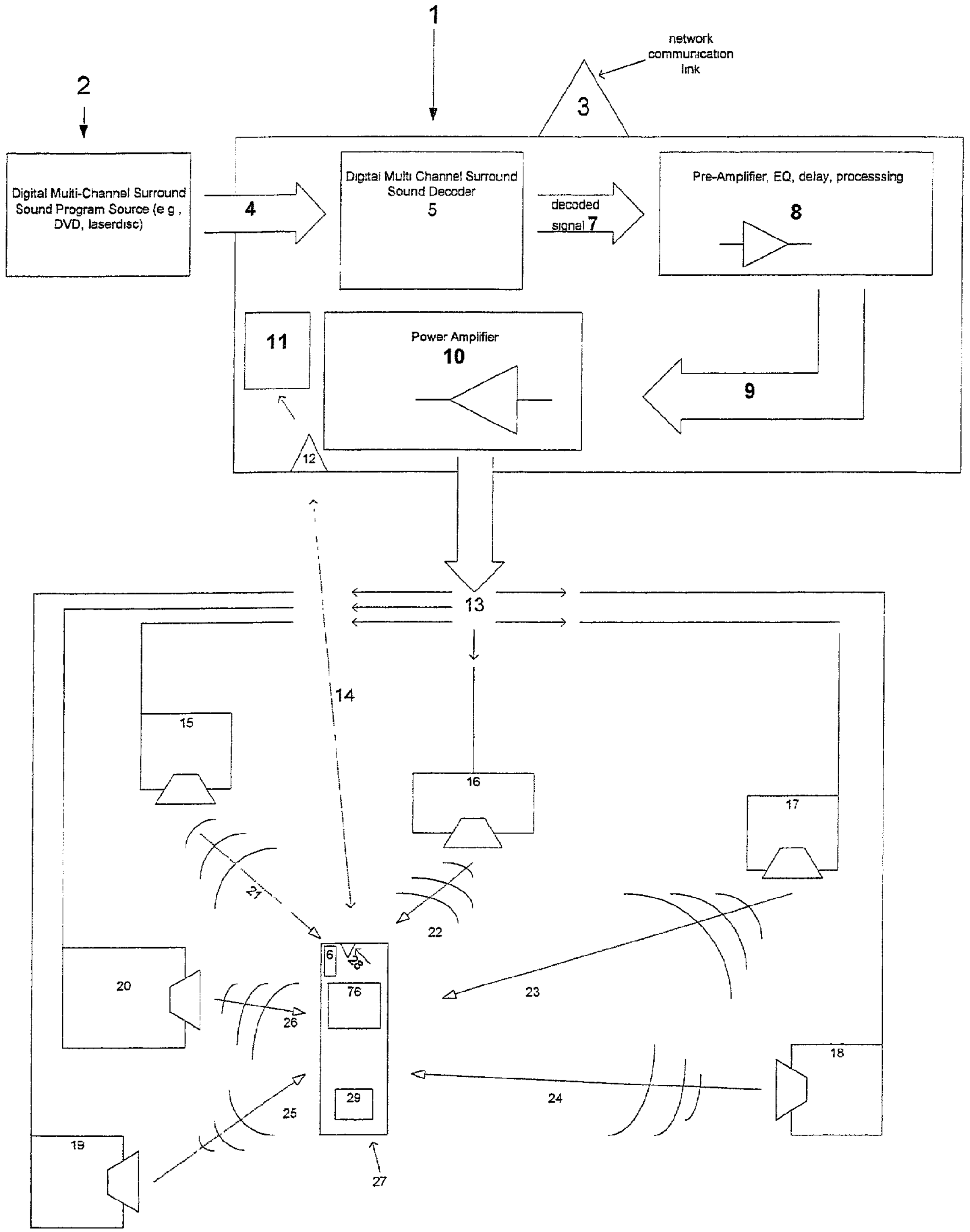
FIG. 1 is an exemplary system diagram in accordance with one embodiment of the present invention, in which a remote control receives test signals generated by six speakers and sends an adjustment command to the main surround sound unit.
Figure 6:
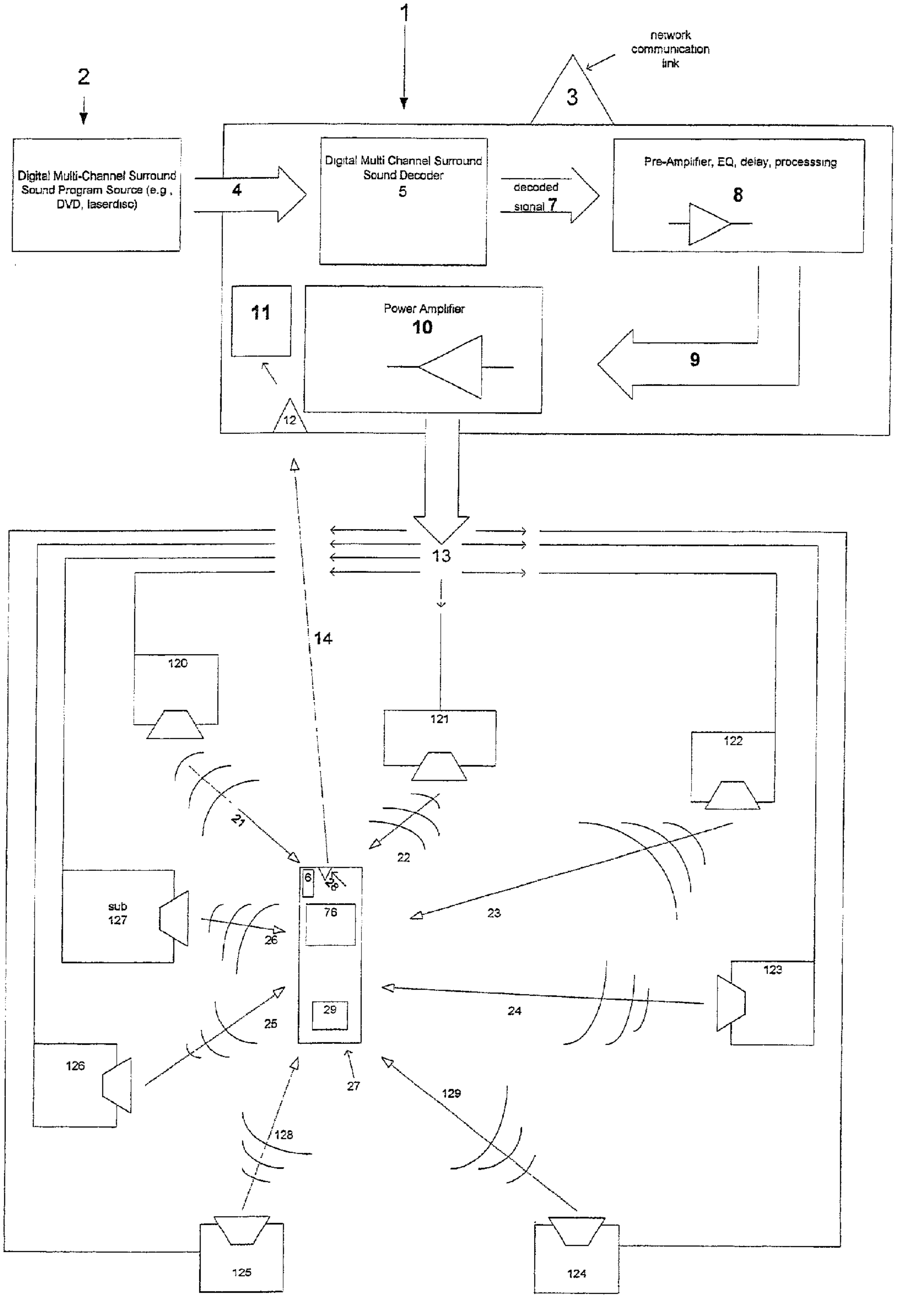
FIG. 6 is an exemplary system diagram in accordance with one embodiment of the present invention, in which a remote control receives test signals generated by seven speakers and sends an adjustment command to the main surround sound unit.

FIG. 1 illustrates by way of example a simplified system diagram representing one embodiment of the present invention, wherein a remote control (27) receives test signals (21–26) generated by six speakers (15–20), then processes the test signals with its onboard processor (29) and then sends an adjustment command(s) information (14) to the main surround sound unit (1) via an electromagnetic communications link (28, 12). For this example, there are six speakers in the surround sound system (15–20) and one of the speakers a sub woofer (20). Of course, it is to be understood that six speakers is described herein for illustration only; that is, the invention also applies to any number of speakers for achieving surround sound with or without a sub woofer (see FIG. 6 for seven speakers embodiment with sub woofer). To optimize the surround sound effect, the listener simply initiates the adjustment process on the remote device (27), and the system automatically adjusts itself to a predetermined optimal setting. Of course, the predetermined setting may be adjusted by the user or adjusted by the manufacturer through a communication medium, such as the Internet.

To make the audio adjustment, a home theatre user first initiates the adjustment process by issuing a command on the remote control unit (27). Thereafter, the communication link device (28) on the remote control device can then communicate with the main surround unit (1) via the communication link on the main surround sound unit (12) by transmitting and receiving electromagnetic signals, for example. The main surround sound unit (1) then initiates the test signals which are originally stored in either the main unit (1) or provided on the digital multi-channel surround sound program source (2) or provided on the remote control unit (27), or the main unit or the program source can download the test signals from the internet via the network communication link (3). The test signals from the speakers (15–20, 120–127) correspond to what the listener should hear from each surround sound speaker, in regard to level, various frequency parameters, and time. For example, the test signals for all of the channels may specify that the listener, at some predetermined position, should hear, from all of the speakers (15–20), sound that has a flat frequency response, arrives at the same time to the listener's ears (i.e., no delay between any of the speakers), and is at the same relative sound pressure level (i.e., if the volume is set to 75 dB, the listener will, in fact, hear 75 dB from each speaker). Alternatively, the test signals may specify that the listener, at some predetermined position should hear from the rear left (19) and rear right (18) speakers sound that is equalized to enhance higher frequencies, and at the same relative decibel level (sound pressure level) as every other speaker. Moreover, the sound produced by the speakers (19) and (18) may arrive slightly later than the front left (15) and front right (17) speakers. The test signal(s) (133) from the output device (135) in the display device (131) are initiated in a similar fashion and correspond to what the home theatre user should see from the output device, in regard to color, contrast, tint, brightness and white level. The calibration routine may be done automatically and/or able to make any type of setting, specified by the test signals.

Figure 2:
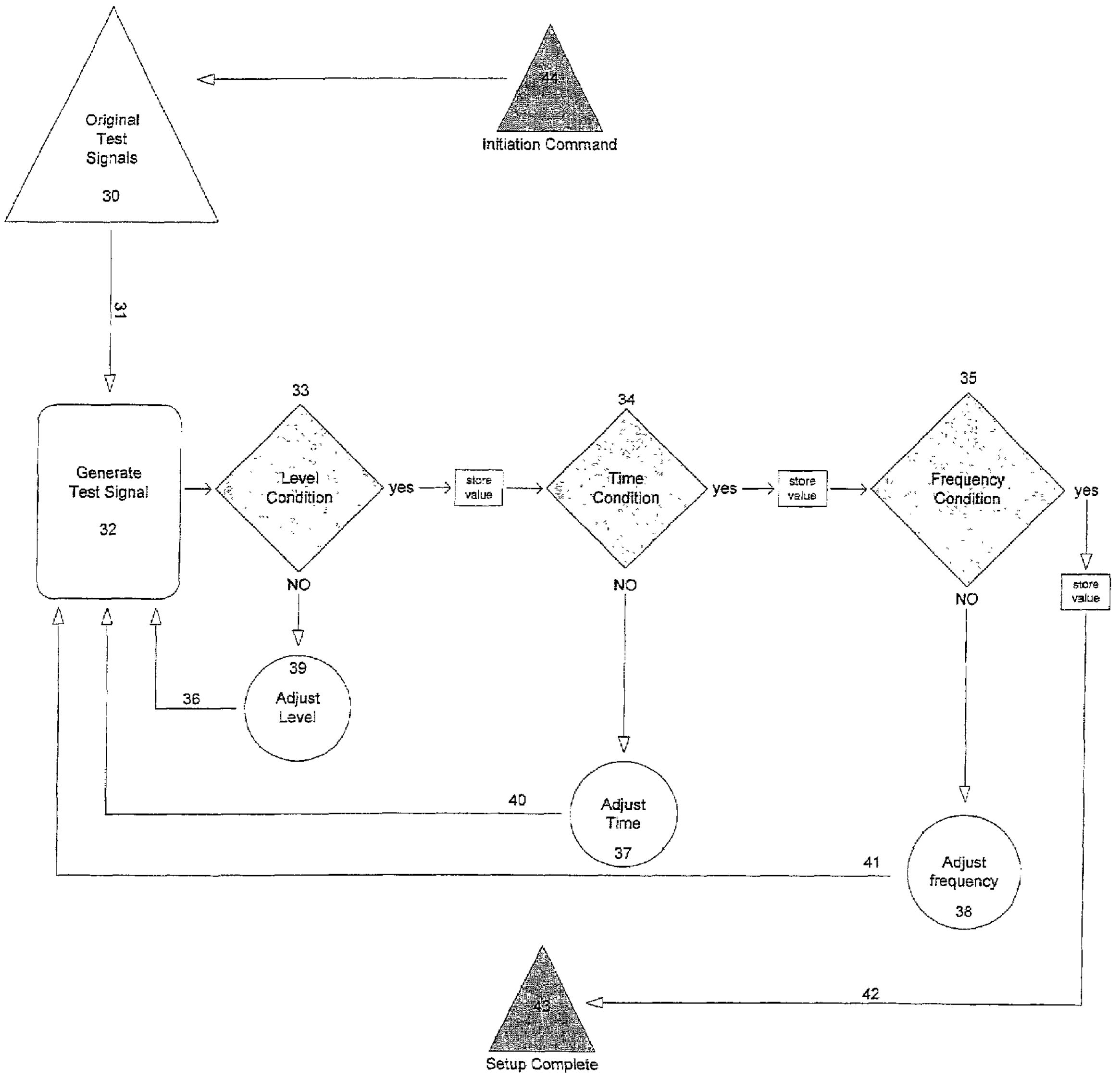
FIG. 2 is an exemplary method diagram in accordance with one embodiment of the present invention, in which the cascaded process of generating a test signal, adjusting a level parameter, a time parameter, and a frequency parameter, is described.

FIG. 2 illustrates by way of example a flow chart that represents a cascaded functional algorithm for the automatic calibration routine for setting up a digital multi-channel surround sound audio system in a home theatre system. The original test signals and/or information about what the listener should hear from each speaker is represented by 30. The information 30 can be stored in either 1 or 2 or 27 in FIG. 1. Alternatively, the test signal information can be stored remotely on a database, and either the program source (2) or the remote control (27) or the main unit (1) can download this information via a telephone modem connection, or other network connection (3). That is, the information 30 may be stored in a variety of methods known to one skilled in the art or methods developed in the future.

After the initiation command (44) is given, the test signals are generated (32) by the speakers (15–20, FIG. 1). For this example, the system may assume that the original test signals (30) specify that the listener should hear sound at the same relative sound pressure level from each speakers, with no delay between each speaker, and at a flat frequency response. The original test signal information (30) (which can be stored in either 1 or 2 or remotely) includes this predetermined information, along with the actual audible test signal (this can be ping noise, pink noise, a tone at a specific frequency, pulses, etc).

After a test signal is generated, the system may run a series of conditional checks to determine if the acoustic parameters are correct, and make the appropriate adjustments. For example, with the level condition 33, if the original test signal information indicates that the listener should hear sound at an equal sound pressure level from each of the individual speakers, then the sensor (6) in the remote control (27) should detect equal decibel levels from each of the individual speakers. In other words, if the volume setting of the power amplifier (10, FIG. 1) is set to 75 decibels, the sensor in the remote control unit should detect the actual sound at or near 75 decibels from each of the speakers. A myriad of factors, however, can affect the quality of sound, such as positioning of the speaker, room acoustics, etc. For example, depending on the configuration of the room and the positioning of the speakers, if the sound is set to X decibels, the listener may actually hear the sound at Y decibels, which is equal to (X+N) decibels, where N is some arbitrary offset factor, which can be positive or negative.

With the present invention, however, once the sensor (6) in the remote device (27) measures the actual sound level, the remote control unit may determine the level correction that is needed, and send this information (14) via the communications link (12, 28) back to the main unit (1) which adjusts the level. Put differently, the present invention corrects for the offset factor N. Alternatively, the remote device may measure the actual sound level, and send this measured level information back to the main unit (1) which may then determine what level of correction is needed, and make that adjustment. For example, if the sensor on the remote actually detects 73 decibels, yet it is set at 75 decibels on the main unit, the remote control unit (27) may send the command to the main unit (1) to adjust the measured speaker volume by +2 decibels. Still further, the remote control unit may send the measured level to the main unit (1), and the main unit may calculate and make the appropriate adjustment. After the adjustment is made, the test signal may be generated with the change (+2 decibels in this example), and the sensor in the remote control again reports the detected level. If more adjustment is needed, the process discussed above continues. If no adjustment is needed, however, the adjustment value is stored and the process moves on.

The information in the original test signals (30) may also specify the time condition for the system. For example, the information in the original test signals (30) may specify that the listener should hear the sound from each of the speakers 15–20 at precisely the same time. Because the listener may not be equidistant from each speaker, the time it takes for a sound signal originating from a particular speaker to travel to the listener may be different. For instance, it may take T milliseconds for a sound signal originating from speaker 16 to travel to the listener, and it may take T+N milliseconds for a sound signal originating from the speaker 17 to travel to the listener. In order for the sound to arrive at the listener from both speakers at the same time, the sound from speaker 17 must be played in advance, or, alternatively, the sound from speaker 16 must be delayed. The information stored in the original test signal may specify which speaker to calibrate the time adjustment to, or specify some synchronization standard to which each speaker may be adjusted.

In FIG. 2, the condition 34 represents the adjustment stage for the time condition in which the test signal is generated in 32, which may be N, where N is some whole integer number, pulses generated by N different speakers. The sensor (6) on the remote control (27) may determine which pulse originated from which speaker. This enables the sensor to measure the difference in time between the arrival of the N pulses. If there is a difference, the processor in the remote control (27) may determine the necessary adjustment that needs to be made (where a delay needs to be applied) and sends the adjustment information to the main unit which makes the correction. The remote control unit may alternatively send the information regarding the arrival times and/or relative delay to the main unit, which then makes the appropriate adjustment calculation and applies it. Still further, the test signal generated in 32 may be one test signal from a single speaker. The sensor on the remote control determines the time delay and calculates the appropriate adjustment that needs to be made in order to properly synchronize the time so that the listener can hear synchronized sound (for example, to synchronize the sound for a particular frame of a movie).

After the adjustment is made (in 8, FIG. 1), a test signal may be generated with the change, and the sensor in the remote control again determines and reports the time delay information. If more adjustment is needed, the loop continues. If no adjustment is needed, however, the adjustment value is stored and the process moves on.

In FIG. 2, the condition 35 represents the adjustment stage for the frequency condition. The test signal information in (32) may include information regarding the frequency settings for single or multiple speakers. For example, the information may indicate that the frequency equalization for all of the speakers in a specified frequency spectrum should be flat. Put differently, the sensor in the remote control may determine, for all the frequencies in that spectrum, what the relative levels are and then make the appropriate adjustment calculations and send them to the main unit (1) for correction. Alternatively, the sensor in the remote control may determine, for all the frequencies in that spectrum, what the relative levels are and send this information to the main unit to make the proper calculations and corrections. After the adjustment is made, the test signal is generated with the change and the sensor (6) in the remote control (27) again determines and reports the frequency information. If more adjustment is needed, the loop continues. If no adjustment is needed, the adjustment value is stored and the process moves on.

In FIG. 2, The frequency and level conditions may be interdependent, so that the conditional checks (33 and 35) may take both factors into account when determining what the adjustments should be made.

Figure 3:
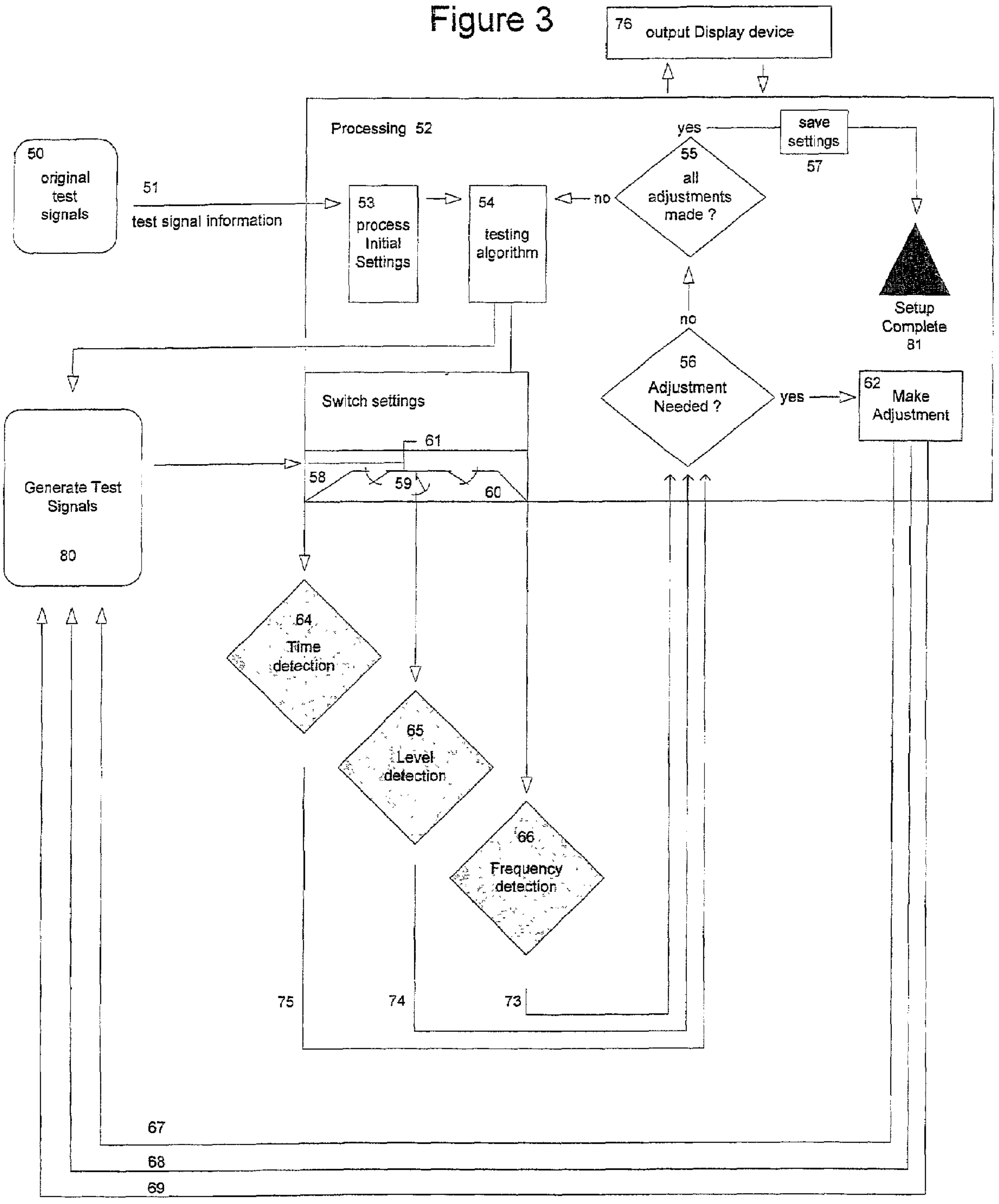
FIG. 3 is an exemplary method diagram in accordance with one embodiment of the present invention, in which the process of generating a test signal, adjusting a level parameter, a time parameter, and a frequency parameter, is described.

FIG. 3 illustrates by way of example a flow chart that represents a parallel functional algorithm for the automatic calibration routine. The original test signals and/or information about what the listener should hear from each speaker is represented by 50 (This information can be stored in either 1 or 2 or 27 in FIG. 1). Alternatively, 50 may be stored remotely and may be downloaded from the Internet, via the network communication link (3) for example. In this way, the algorithm may be modified for updates so that it may be downloaded. After the initiation command (51) is given, the system initially processes the test signal information (53) to determine what the desired multi-channel sound settings are, i.e., the sound pressure level, the frequency level, the time delay, and to specify a testing algorithm (54). That is, the algorithm may be specified to test the different elements (time, frequency, and level) and/or how to test the different elements (parallel or serially) and/or which elements to test. All of the system processing (52) may be performed in a variety of ways, for example, it may be performed through the remote control (27) or the main surround sound unit (1) or the program source unit (2).

The testing algorithm (54) may instruct the software condition switch (61) so that the system can properly set which conditions should be checked according to the testing algorithm (54). For example, if the original test signal information specifies that the sound the listener should hear should be at an equal sound pressure level, flat equalization, and at an equal time (no delay between the arrival of sound at the listeners ears), the initial processing (53) may specify an adjustment algorithm (54) so that the sound pressure level and frequency conditions may be checked first, simultaneously, and once these levels are set, the time condition may be checked and set. In this example, the algorithm may include the appropriate information for the software switch (61) to turn off the time condition switch (60), and turn on the level and frequency condition switches (58, 59) so that the sound pressure level and frequency conditions may be checked first. The algorithm then forwards the initial level and frequency settings to generate the test signals (80) which are generated by the speakers (15–20, 120–127). Once the software switch (61) is properly set, the frequency and level detection may be done in parallel at 65 and 66, respectively.

Thereafter, a sensor (6) in the remote control unit (27) reports the detected sound pressure level and frequency characteristics of the test signal (represented by steps 65 and 66 on the method flowchart FIG. 3). The sensor (6) may be a single condenser microphone and/or multiple condenser microphones and/or multiple microphones optimized for different frequency spectrums. Of course, other sensors known to one skilled in the art may be used as well. The remote control (27) may process the information obtained by the sensor (6) with its internal processor (29) and send the adjustment settings back to the main unit (1) via the communications link (12, 28). Alternatively, the remote control unit (27) may send the information obtained by the sensor (6) to the main unit (1) via the communications link (12, 28), and the processor (11) in the main unit (1) may determine the necessary adjustments.

With regard to the flowchart FIG. 3, the information obtained by the sensor (6) may occur in (65) and (66) and is then processed in the processor (52). The measured levels are processed (52) to determine if further adjustment is needed (56). If the detected levels (sound pressure and frequency) are equal or within an acceptable range to the levels specified in the test signal information (50), the adjustment for those levels may be stored, and the system continues. If, however, more adjustment is needed, the processing (52) may make a further adjustment (62). Further, there may be multiple sub-levels of the frequency level detection and setting (i.e., the frequency level test may include X sub tests of various frequencies). The frequency and level conditions may be interdependent, so that processing (52) may take both factors into account when determining what the adjustments (62) should be. For example, even though the level condition may already be optimal (i.e., the detected level is equal to the desired level specified in the test signal information), if the frequency settings are changed, the overall level may be affected and may have to be adjusted again to achieve an optimal setting for both sound pressure level and individual frequency levels. The processing software may determine what adjustments need to be made in order to achieve the desired results for both the frequency and level settings.

After the adjustment is made (62), the test signal may be generated (80) with the changes (for both the frequency and level), and the sensor (6) in the remote control (27) again reports the detected levels. If more adjustment is needed, the adjustment and processing continues. If no adjustment is needed, however, the processing software may determine if there are any other adjustments that need to be made (55). If there are other adjustments that need to be made (in this example, the time delay still needs to be set), the testing algorithm (54) will specify to the switch (61) which detection element(s) should be turned on and which detection element(s) should be turned off. For this example, the processing (52) instructs the switch (61) to turn off the level and frequency detection (59, 60) and turn on the time detection (58). The routine for the time delay adjustment then begins.

For the time delay, the test signals generated in 80 may be N, where N is some whole integer number, pulses generated by N different speakers. The sensor (6) in the remote control unit (27) detects which pulse originated from which speaker. The remote control (27) may process the information obtained by the sensor (6) with its internal processor (29) and send the adjustment settings back to the main unit (1) via the communications link (12, 28). Alternatively, the remote control unit (27) may send the information obtained by the sensor (6) to the main unit (1) via the communications link (12, 28), and the processor (11) in the main unit (1) may determine the necessary adjustments. With regard to the method flowchart FIG. 3, the time delay information obtained by the sensor (6) occurs in (64) and is then processed (52).

The sensor (6) on the remote control (27) may determine which pulse originated from which speaker. This enables the sensor to measure the difference in time between the arrival of the N pulses (64). If there is a difference, the processor (29) in the remote control (27) may determine the necessary adjustment that needs to be made (where a delay needs to be applied) and sends the adjustment information to the main unit (1) which makes the correction. This may be accomplished in the processing stage in the method flowchart (52). The remote control unit may alternatively send the information regarding the arrival times and/or relative delay to the main unit, which then makes the appropriate adjustment calculation and applies it. Alternatively, the test signal generated in 80 may be one test signal from a single speaker. The sensor (6) on the remote control (27) determines the time delay and calculates the appropriate adjustment that needs to be made in order to properly synchronize the time so that the listener hears a sound to some predetermined timing, for example to synchronize the sound for a particular frame of a movie. Again, this is accomplished in the processing stage in the method flowchart (52). After the adjustment is made, the test signal may be generated with the change and the sensor (6) in the remote control (27) again determines and reports the time delay information (64). If the processing (52) determines more adjustment is needed, the loop continues. If no adjustment is needed, the adjustment value is stored and the process moves on. When all of the information is correct as specified in the original test signal (50) information, the processing (52) saves the settings (57) and the setup is complete (81).

Figure 4:
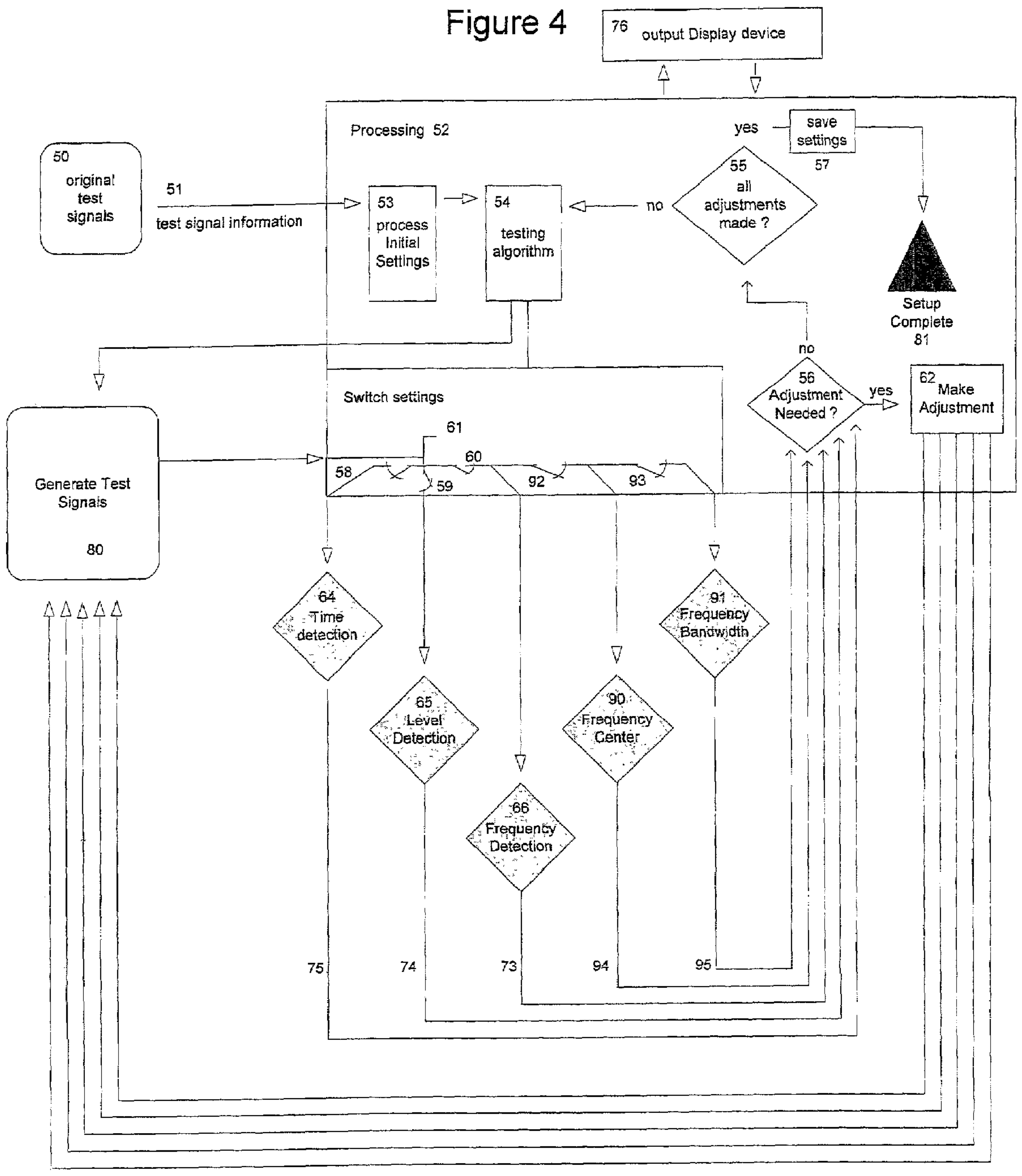
FIG. 4 is an exemplary method diagram in accordance with one embodiment of the present invention, in which the process of generating a test signal, adjusting a level parameter, a time parameter, a frequency level parameter, a frequency center parameter, and a frequency bandwidth parameter is described.

FIG. 4 illustrates by way of example a flow chart that represents a functional algorithm for the automatic calibration routine, similar to the embodiment described above for FIG. 3, with two additional criteria for detection; namely, a frequency center (90) detection and a frequency bandwidth detection (91). The original test signals and/or information about what the listener should hear from each speaker is represented by 50 (This information may be stored in either 1 or 2 or 27 in FIG. 1). Alternatively, 50 may be stored remotely on a computer and can be downloaded via a global and/or local and/or wide area network connection (3). After the initiation command is given (51), the system initially processes the test signal information (53) to determine what the desired multi channel sound settings are, such as sound pressure level, frequency level, frequency center, frequency bandwidth, and time delay, and to specify a software testing algorithm (54). The software testing algorithm may specify which order to test the different elements (time, frequency level, frequency center, frequency bandwidth, and sound pressure level) and/or how to test the different elements (parallel or serially) and/or which elements to test.

Each detection which is to be set: sound pressure level, frequency level, frequency center, frequency bandwidth, and time delay, may be represented in the algorithm as variables $D_{spl}$, $D_{fl}$, $D_{fc}$, $D_b$ and $D_t$, respectively. If two criteria are to be detected and set simultaneously, the algorithm may represent them with an '&' symbol. Further, a coefficient may be attached to an individual variable, or group of variables connected with an '&' symbol to indicate the order of testing. So, for example, if the algorithm specifies checking and setting the Sound Pressure Level, frequency level, frequency center, and frequency bandwidth simultaneously first, and then check and set the time delay, it may specify the algorithm: $1(D_{spl}$ & $D_{fl}$ & $D_{fc}$ & $D_b)$, $2(D_t)$. Each detection and setting ($D_{spl}$, $D_{fl}$, $D_{fc}$, $D_b$ and $D_t$) may contain subsets of detections and setting. For example, the frequency level may contain J independent tests for J different frequencies. The software algorithm may specify testing all J independent frequencies simultaneously, or sequentially. The software algorithm may also determine an appropriate test signal. The algorithms can be predetermined in the system and/or can be determined at the time of testing and/or can be catered to the information in the program source. There may be many possible combinations of the order of testing of the different elements. All of the system processing (52) can be performed in either the remote control (27) or in the main surround sound unit (1) or the program source unit (2) or in the actual speakers (15–20, 120–126). The system processing (52) may include a Digital Signal Processor and/or with analog processing means. Both methods of analyzing and manipulating acoustic data are well appreciated in the art. The testing algorithm (54) may instruct the software condition switch (61) so that the system can properly set which conditions should be checked according to the testing algorithm (54). The software switch (61), properly set allows the appropriate detection's to be done in parallel or serially.

The detection and setting for sound pressure level, frequency level, and time condition is substantially similar to the discussion above related to FIGS. 3 and 4. For the frequency center, the sensor (6) in the remote control unit (27) reports the detected center frequency or frequencies of the test signal(s) (represented by step 92 on the method flowchart FIG. 4). The measured center levels are processed (52) to determine if adjustment is needed (i.e., the detected frequency center is different from the specified frequency center in the test signal). If the detected centers (frequency center) is equal or within an acceptable range to the centers specified in the test signal information (50), the adjustment for those center frequencies may be stored, and the system may continue. If, however, more adjustment is needed, the processing (52) may make further adjustments (62). The frequency center may be interdependent with the other settings, so that processing (52) may take multiple factors into account when determining what the adjustments (62) should be. For example, even though the frequency center may already be optimal (i.e., the detected center is equal to the desired center specified in the test signal information), the algorithm may calculate that if the frequency levels are changed, the center may be affected and may have to be changed slightly to achieve an optimal setting for both level and frequency center. The processing software may determine what adjustments need to be made to achieve the desired results for the frequency center and any other detection criteria which may be affected. After the adjustment is made (62), the test signal may be generated (80) with the change (for both the frequency center and frequency level), and the sensor (6) in the remote control (27) again reports the detected levels. If more adjustment is needed, the adjustment and processing continues. That is, one feature of the present invention is that when setting one particular criteria (64, 65, 66, 90, 91), the system processing (52) may take another criteria into account to determine what overall adjustments need to be made (56). Note that all of the criteria (64–66, 90, 91) may be interdependent.

The adjustment for the frequency bandwidth is substantially similar to the adjustment for the frequency center described above.

II. Automatic Adjustment of Visual Parameters

Figure 5:
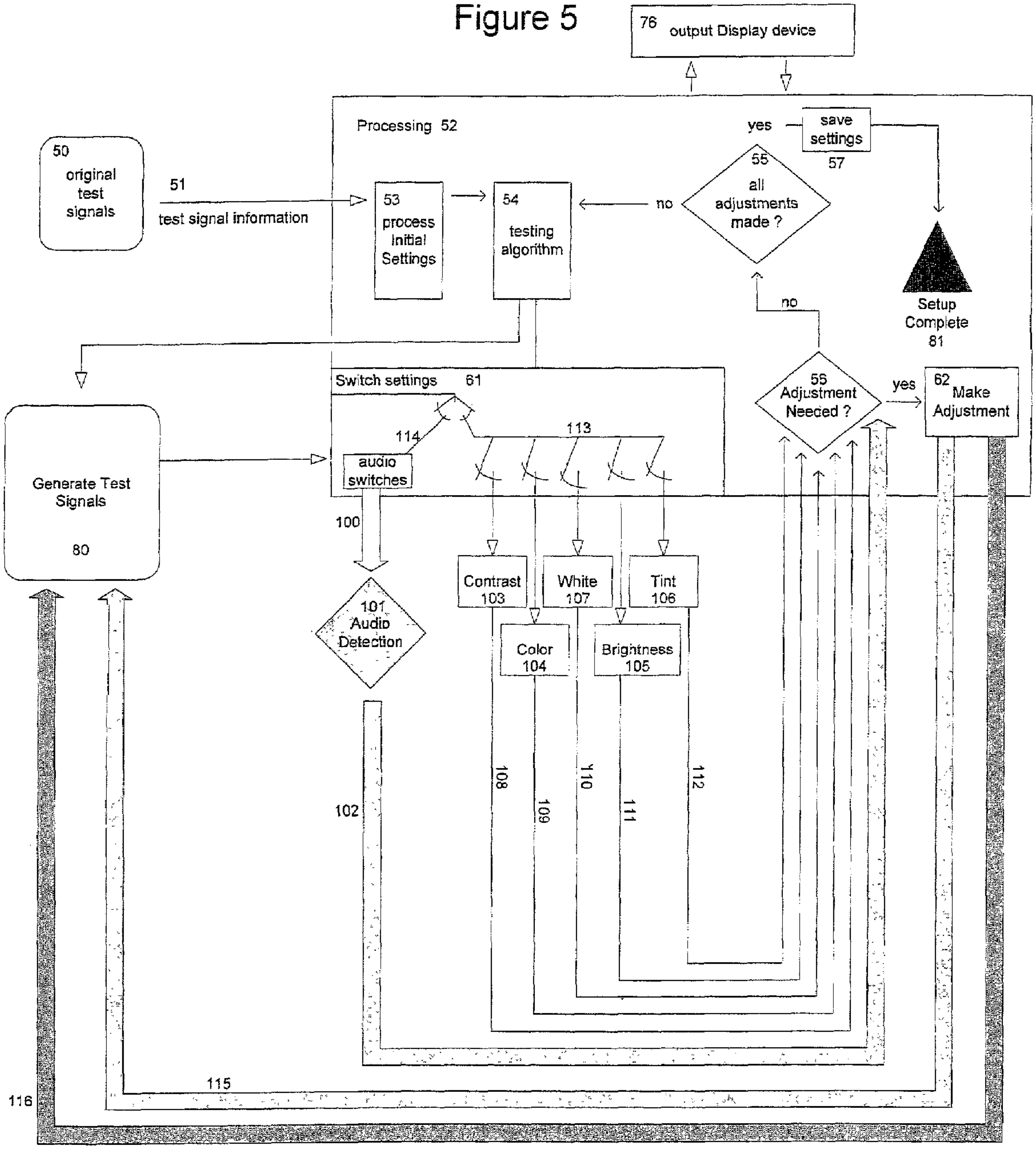
FIG. 5 is an exemplary method diagram in accordance with one embodiment of the present invention, in which the process of generating a test signal, adjusting a level parameter, a time parameter, a frequency level parameter, a frequency center parameter, and a frequency bandwidth parameter, a tint parameter, a color parameter, a brightness parameter, a white level parameter, and a contrast parameter is described.
Figure 7:
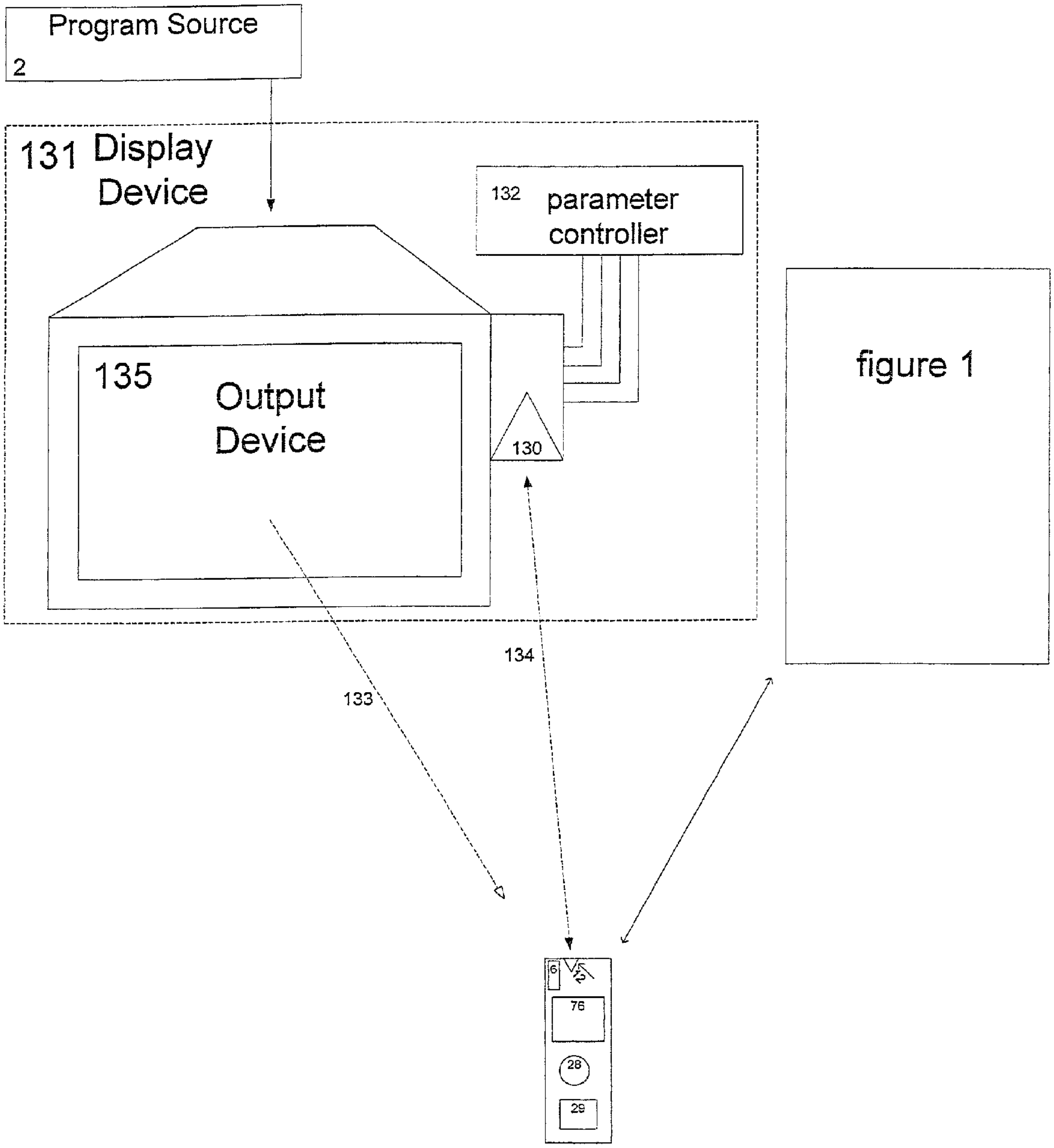
FIG. 7 is an exemplary system diagram in accordance with one embodiment of the present invention, in which a remote control receives test signals generated by seven speakers and receives test signals generated by a display device and sends adjustment commands to the main surround sound unit and to the display device.

FIG. 5 illustrates by way of example a flow chart that represents a functional algorithm for the automatic calibration routine, similar to the embodiment described above for FIG. 4, with additional criteria for detection; namely, visual detection for the display used in the home theatre environment (i.e., Television, Projector, LCD, plasma display) which may include Contrast detection, Color detection, White level detection, Sharpness detection, tint detection, and/or brightness detection. The corresponding system diagram is represented by FIG. 7. The detection and setting for acoustic criteria (in FIG. 5) is substantially the same as described in the embodiment representing FIG. 4. The switch settings (61) in FIG. 5 include a higher level switch which can select between audio (114) and/or video (113) detection. The original test signals and/or information so that the viewer should view from the display is represented by 50 may be stored in either 1 and/or 2 and/or 27 and/or 131.

Alternatively, the original test signals 50 may be stored remotely on a computer and can be downloaded by the display device (131), the program source (2), the surround sound main unit (1), and the remote control unit (27) internet. Of course, the original test signals 50 may be downloaded through a local and wide area network connection as well. For example, a specific movie director may desire certain visual settings for a particular movie, and may offer this information on an internet web site, or alternatively include this information on the storage medium (i.e., DVD) for the movie (2). After the initiation command is given (51), the system initially processes the test signal information (53) to determine what the desired optical viewing settings are, in regard to contrast, white level, tint, color, and brightness, to specify a software testing algorithm (54). The software testing algorithm then specifies the order in which to test the different visual detection elements and/or how to test the different elements (parallel or serially) and/or which elements are to be tested. Each of the detection's which are to be set, contrast, white level, tint, color, and brightness, may be represented in the algorithm as variables $V_{contrast}$, $V_{color}$, $V_{white}$, $V_{bright}$, and $V_{tint}$ respectively. If two criteria are to be detected and set simultaneously, the algorithm may represent them with an '&' symbol. Further, a coefficient may be attached to an individual variable, or group of variables connected with an '&' symbol to indicate the order of testing. For example, if the algorithm specifies that checking and setting the contrast, white level, and brightness first, and then checking and setting the tint and color, it may specify the algorithm: $1(V_{bright}$ & $V_{contrast}$ & $V_{white})$, $2(V_{color}$ & $V_{tint})$.

Each detection and setting criteria may contain subsets. For example, the color detection may contain J independent tests for J different color frequencies. The software algorithm may specify testing all J independent color frequencies simultaneously, or sequentially. The software algorithm may also determine an appropriate visual test signal. The algorithms can be predetermined in the system and/or can be determined at the time of testing and/or can be catered to the information in the program source. There may be many possible combinations of the order for testing the different elements. All of the system processing (52) can be performed in either the remote control (27), the main surround sound unit (1), the program source unit (2), or in the display device (131). The system processing (52) may include a Digital Signal Processor and/or an analog processing means. The testing algorithm (54) may instruct the software condition switch (61) so that the system can properly set which conditions should be checked according to the testing algorithm (54). Once the software switch (61) is properly set, the appropriate detection's may be done in parallel or serially.

For visual detection (103–107) and processing (52), the test signal(s) may include a myriad of patterns and/or signals. For brightness, contrast, tint, and white level, the test signals may include grayscale patterns, intensity maps, brightness maps, and individual frequency signals (i.e., white screen). For color, the test signals may include color maps, color patterns, grayscale patterns, and individual color frequency signals (i.e., blue screen, red screen, green screen). The sensor (6) or plurality of sensors (6) in the remote control unit (27) reports the detected visual characteristic of the test signal (103–107) on the method flowchart FIG. 5. The sensor (6) in the remote control (27) may include, an optoelectric sensor, a luminance detector, an optical comparator, a color analyzer, a light sensitive sensor, and a digital camera for detecting visual elements (103–107, FIG. 5). Devices to detect and measure color, white level, brightness, contrast and tint are well appreciated in the art. The measured visual criteria may be processed (52) to determine if adjustment is needed (i.e., the detected visual level is different from the specified level in the test signal). If the visual element is equal to or within an acceptable range to the visual element specified in the test signal information (50), the adjustment for the visual element may be stored, and the system may continue. If, however, more adjustment is needed, the processing (52) may make a further adjustment (62).

Each visual element for detecting (103–107) may be interdependent to other visual elements (104–107), so that processing (52) may take multiple factors into account when determining the adjustment(s) (62) that needs to be made. The visual elements can be detected and processed in parallel or serially. After the adjustments (if needed) are made (62), the test signal may be generated (80) with the change, and the sensor(s) (6) in the remote control (27) again reports the detected level(s). If more adjustment is needed, the adjustment and processing continues. If there are still other visual adjustments that need to be made according to the testing algorithm, the processing may specify to the switch (61) which detection element(s) should be turned on and off. When all of the visual information is correct as specified in the original test signal (50) information, the testing setting and processing stops and the setup is complete.

Another application of the present invention is a home theatre system in which a user may be able to view all of the adjustment settings, view frequency graphs, select adjustment settings, view test signal information, and generally follow the adjustment process by viewing, and interacting with a display device (76) attached to the remote control unit (27). The display device may be a color or black and white LCD (liquid crystal display) screen, which may be touch screen enabled (so the user may input commands). The processing (52) in the system may include a connection to the display device so that any stage of the adjustment process can be outputted. For example, the user may be able to view on the display screen (76) frequency response curves from a given speaker. As a further example, the user may be able to view and select multiple configurations for automatic calibration. As yet another example, the listener may be able to choose and select between different visual settings, such as black and white, mellow, faded, high contrast, etc.

Yet another feature of the present invention is that all of the system processing (52) may be performed on the on-board processor (29) in remote control unit (27), with the settings then sent to the main unit (1), program source (2), and display device (131) for storage. The on-board processor (29) may include a DSP (Digital Signal Processor), an analog signal processor, and a microcomputer. The processor (29) may also be coupled to the output display device (76) to view information relating to the adjustment settings. The processor may also send information via electromagnetic link (12, 130) to the display device (131) to view information relating to the adjustment settings on the output device (135) of the display device (131). Alternatively, all of the system processing (52) may be performed on the processor in the main unit (1), the program source (2), the display device (131); the appropriate information is then sent via the communications link (12) to the remote control unit's (27) display device (76) for output.

Another application of the present invention is for a modern digital surround sound system that includes an optional band-limited low frequency effects (LFE) channel, in addition to the discrete and main channels. In contrast to the main channels, the LFE delivers bass-only information and has no direct effect on the perceived directionality of the reproduced soundtrack. The LFE channel carries additional bass information to supplement the bass information in the main channels. The LFE channel may be realized by sending additional bass information through any one or combination of the main speakers (15–20). The proper settings for the LFE channel can be obtained through the process outlined in FIGS. 2, 3, 4, and 5. For example, the signal in the LFE channel may be calibrated during soundtrack production to be able to contribute 10-Decibel higher Sound Pressure Level than the same bass signal from any one of the front channels. In other words, the process in FIGS. 2, 3, 4, and 5 proceed with a set of test signals and test signal information, for the channels which make up the LFE channel.

We claim:

1. A method for automatically adjusting at least one of a predetermined plurality of parameters in a home theatre system, the method including the steps of:

sending a visual test signal based upon a predetermined setting to a hand-held remote control, wherein the visual test signal is designed to set a home theatre system;

detecting the visual test signal by the hand-held remote control;

processing the visual test signal by the hand-held remote control to determine an adjustment information based upon the predetermined setting so that the visual test signal when adjusted to the adjustment information is substantially similar to the predetermined setting; and producing an adjusted visual test signal that modifies the test signal based upon the adjustment information to substantially match the predetermined setting, where the visual test signal is a visual video test signal.

2. The method of claim 1 further including the steps of:

sending the adjusted visual test signal to the hand-held remote control;

detecting the adjusted visual test signal by the hand-held remote control;

wherein if the adjusted visual test signal is not substantially similar to the predetermined setting then:

processing the adjusted visual test signal by the hand-held remote control to determine a second adjustment information based upon the predetermined setting so that the adjusted visual test signal when adjusted to the second adjustment information is substantially similar to the predetermined setting; and producing a second adjusted test signal that modifies the adjusted visual test signal based upon the second adjustment information to substantially match the predetermined setting.

3. The method of claim 1 wherein the processing is done by a digital signal processor to process the visual test signal.

4. The method of claim 1 wherein the processing is done by an analog signal processor to process the visual test signal.

5. The method of claim 1, further including the steps of:

providing an output device to display information relating to the adjustment processing.

6. A method for automatically adjusting at least one of a predetermined plurality of parameters in a home theatre system, the method including the steps of:

sending a visual test signal based upon a predetermined setting to a hand-held remote control receiver, wherein the visual test signal is designed to set a home theatre system;

detecting the visual test signal by the hand-held remote control receiver;

processing the visual test signal by the receiver to determine an adjustment information based upon the predetermined setting so that the visual test signal when adjusted to the adjustment information is substantially similar to the predetermined setting; and producing an adjusted test signal that modifies the visual test signal based upon the adjustment information to substantially match the predetermined setting, where the visual test signal is a visual video test signal, sending the adjusted visual test signal to the hand-held remote control receiver;

detecting the adjusted visual test signal by the hand-held remote control receiver;

wherein if thee adjusted visual test signal is not substantially similar to the predetermined setting then:

processing the adjusted visual test signal by the hand-held remote control receiver to determine a second adjustment information based upon the predetermined setting so that the adjusted visual test signal when adjusted to the second adjustment information is substantially similar to the predetermined setting; and producing a second adjusted visual test signal that modifies the adjusted test signal based upon the second adjustment information to substantially match the predetermined setting.

7. The method of claim 6 wherein the processing is done by a digital signal processor to process the visual test signal.

8. The method of claim 6 wherein the processing is done by an analog signal processor to process the visual test signal.

9. The method of claim 6, further including the steps of:

providing an output device to display information relating to the adjustment processing.

10. A method of adjusting at least one of a predetermined plurality of parameters in a home video system, the method including:

sending a test video signal based upon a predetermined setting to a hand-held remote control;

receiving the test video signal by the hand-held remote control;

processing the test video signal received by the hand-held remote control to determine an adjustment information based upon the predetermined setting so that the test video signal when adjusted to the adjustment information is substantially similar to the predetermined setting; and producing an adjusted test signal that modifies the test video signal based upon the adjustment information to substantially match the predetermined setting.

11. The method of claim 10, where the processing is done by a processor within the hand-held remote control.

12. The method of claim 10, where the hand-held remote control has a sensor to detect the test video signal.

13. The method of claim 10, further including:

sending the adjusted test signal to the hand-held remote control;

receiving the adjusted test signal by the hand-held remote control;

where if the adjusted test signal is not substantially similar to the predetermined setting then:

processing the adjusted test signal by the hand-held remote control to determine a second adjustment information based upon the predetermined setting so that the adjusted test signal when adjusted to the second adjustment information is substantially similar to the predetermined setting; and producing a second adjusted test signal that modifies the adjusted test signal based upon the second adjustment information to substantially match the predetermined setting.

* * * * *